(12) United States Patent
Mahler et al.

(10) Patent No.: US 8,749,075 B2
(45) Date of Patent: Jun. 10, 2014

(54) INTEGRATED CIRCUITS AND A METHOD FOR MANUFACTURING AN INTEGRATED CIRCUIT

(75) Inventors: Joachim Mahler, Regensburg (DE); Lukas Ossowski, Waldetzenberg (DE); Khalil Hosseini, Weihmichl (DE); Ivan Nikitin, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/602,359

(22) Filed: Sep. 4, 2012

(65) Prior Publication Data

US 2014/0061878 A1    Mar. 6, 2014

(51) Int. Cl.
*H01L 23/28* (2006.01)
*H01L 23/29* (2006.01)

(52) U.S. Cl.
USPC ........... 257/788; 257/787; 257/789; 257/783; 257/795; 257/659; 257/E23.116

(58) Field of Classification Search
CPC ..... H01L 23/28; H01L 23/29; H01L 23/3128; H01L 23/3192

USPC ........... 257/783, 787–789, 795, 659, E23.116
See application file for complete search history.

(56) References Cited

U.S. PATENT DOCUMENTS

| | | | | |
|---|---|---|---|---|
| 5,371,404 | A * | 12/1994 | Juskey et al. | 257/659 |
| 5,565,706 | A * | 10/1996 | Miura et al. | 257/723 |
| 6,025,995 | A * | 2/2000 | Marcinkiewicz | 361/760 |
| 6,271,469 | B1 * | 8/2001 | Ma et al. | 174/521 |
| 6,784,541 | B2 * | 8/2004 | Eguchi et al. | 257/723 |
| 7,300,824 | B2 * | 11/2007 | Sheats | 438/126 |
| 2003/0059976 | A1 * | 3/2003 | Nathan et al. | 438/106 |
| 2003/0141105 | A1 * | 7/2003 | Sugaya et al. | 174/256 |
| 2011/0031602 | A1 * | 2/2011 | Wowra et al. | 257/690 |
| 2011/0273957 | A1 * | 11/2011 | Guizelin et al. | 367/20 |
| 2012/0241222 | A1 * | 9/2012 | Mirchandani et al. | 175/374 |

\* cited by examiner

*Primary Examiner* — Nitin Parekh (57) ABSTRACT

An integrated circuit is provided. The integrated circuit includes: a chip and encapsulation material covering at least three sides of the chip, the encapsulation material being formed from adhesive material. The integrated circuit includes a carrier adhered to the chip by means of the encapsulation material.

20 Claims, 7 Drawing Sheets

INTEGRATED CIRCUITS AND A METHOD FOR MANUFACTURING AN INTEGRATED CIRCUIT

TECHNICAL FIELD

Various embodiments relate generally to integrated circuits and a method for manufacturing an integrated circuit.

BACKGROUND

Up until now, semiconductor chips and semiconductor chip packages may be manufactured by first adhering chips to a carrier or lead frame and then subsequently, usually after further processing, encapsulating the chips with further material, such as a polymer material. Several challenges may be associated with these manufacturing processes. Sawing may have to be carried out through brittle silicon and soft polymer material. Furthermore, multiple processes may necessarily be dependent on each other. Multiple materials, for example, adhesive materials, encapsulation materials and fixing materials may be required. Processes for depositing different materials may need to be well integrated with each other. Furthermore, the different materials may have to be suitable and/or well matched for use with each other.

SUMMARY

Various embodiments provide an integrated circuit, including: a chip; encapsulation material covering at least three sides of the chip, wherein the encapsulation material is formed from adhesive material; and a carrier adhered to the chip by means of the encapsulation material.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments provide an integrated circuit, e.g. a chip arrangement, wherein a semiconductor chip may be partially and/or completely encapsulated or surrounded by an adhesive material, wherein the adhesive material may be thermally and/or electrically conductive.

Various embodiments provide an integrated circuit chip arrangement, wherein the adhesive material may include an electrically conductive material, which may be used for electrically contacting and rewiring the chip.

Various embodiments provide an integrated circuit chip arrangement, wherein the adhesive material, may be used for adhering or connecting a chip to a chip carrier, such as a lead frame material, and also for encapsulating the chip.

Various embodiments provide methods for manufacturing the described integrated circuits and chip arrangements.

Figure 1:
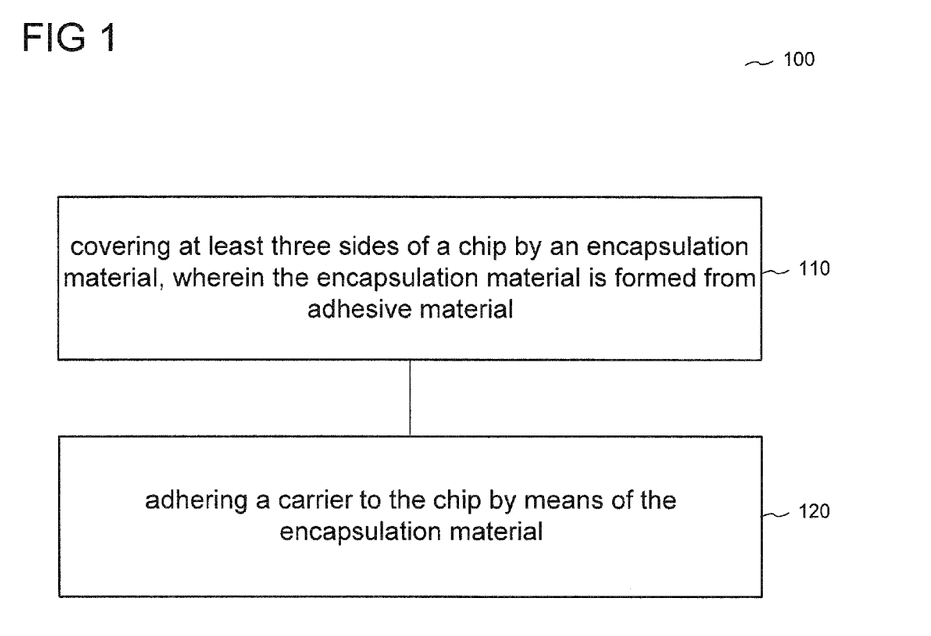
FIG. 1 shows a method for manufacturing an integrated circuit according to an embodiment.

FIG. 1 shows method 100 for manufacturing an integrated circuit according to an embodiment. Method 100 may include:

covering at least three sides of a chip by an encapsulation material, wherein the encapsulation material is formed from adhesive material (in 110); and adhering a carrier to the chip by means of the encapsulation material (in 120).

FIGS. 2A to 2G show cross-sectional illustrations of method 200 for manufacturing an integrated circuit according to an embodiment.

Figure 2A:
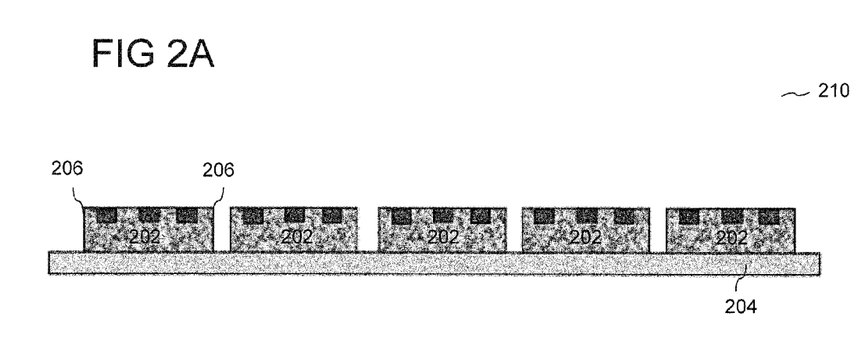
FIGS. 2A to 2F show a method for manufacturing an integrated circuit according to an embodiment.

As shown in view 210 of FIG. 2A, a semiconductor wafer substrate may be individualized, e.g. diced, into individualized chips 202, also referred to as dies.

The semiconductor wafer substrate may include various materials, e.g. semiconductor materials. The wafer substrate may include at least one from the following group of materials, the group of materials consisting of: Silicon, Germanium, Group III to V materials, polymers. According to an embodiment, the wafer substrate may include doped or undoped silicon. According to another embodiment, the wafer substrate may include a silicon on insulator SOI wafer. According to an embodiment, the wafer substrate may include a semiconductor compound material, e.g. gallium arsenide (GaAs), indium phosphide (InP), gallium nitride (GaN), silicon carbide (SiC). According to an embodiment, the wafer substrate may include a quaternary semiconductor compound material, e.g. indium gallium arsenide (InGaAs).

Chips 202 may each have a thickness tC ranging from about 150 µm to about 900 µm, e.g. about 200 µm to about 400 µm. Accordingly, encapsulation material 218 may have a thickness tE ranging from about 200 µm to about 1100 µm, e.g. about 250 µm to about 500 µm.

The individualization of chips 202 may be carried out according to standard processes, e.g. sawing. During the individualization process or processes, the wafer may be held by dicing carrier 204, e.g. dicing tape or foil. Dicing carrier 204 may allow the plurality of individualized chips 202 to be held by a common continuous carrier. In order to ensure electrical passivation and/or good electrical insulation strength of chip side walls 206, at least one additional isolation layer 207 (not shown), e.g. an electrically insulating layer may optionally be deposited over chip side walls 206. Additional isolation layer 207 may be for example silicon dioxide ($SiO_2$) or silicon nitride ($Si_3N_4$), and may be several micrometers thick. Additional isolation layer 207 may be deposited, for example by chemical vapor deposition (CVD).

Figure 2B:
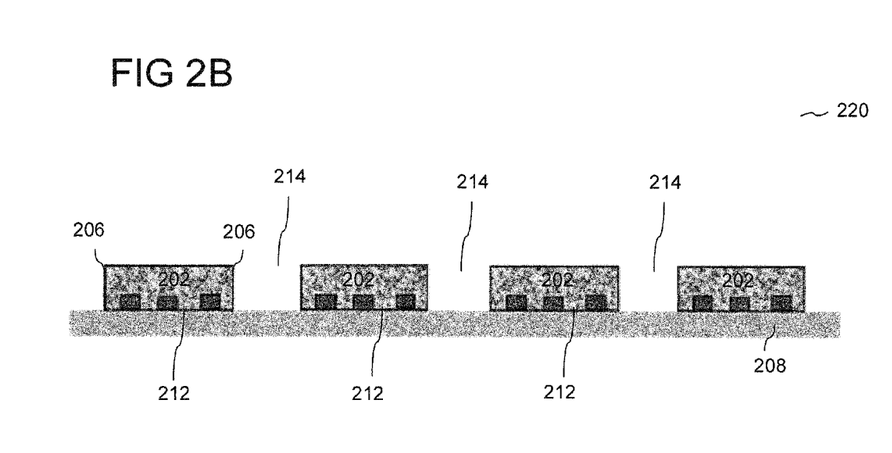

As shown in view 220 of FIG. 2B, the plurality of individualized chips 202 may be temporarily adhered, e.g. laminated or glued, onto temporary carrier 208. Individualized chips 202 may be adhered with their front sides 212 facing and mounted onto temporary carrier 208. Temporary carrier 208 may include a foil, such as an elastic foil, which may be expanded or stretched. Therefore, larger gaps 214 may be formed between neighboring chips 202.

In the following description, reference may be made to processes carried out on a single chip. It may, however, be understood, that the processes described herein and hereinafter, may also be applied to a plurality of chips, e.g. one, two, three, four, etc., or even tens, hundreds or even thousands of chips. In other words, batch processing also known as parallel processing of the plurality of chips may be carried out.

Figure 2C:
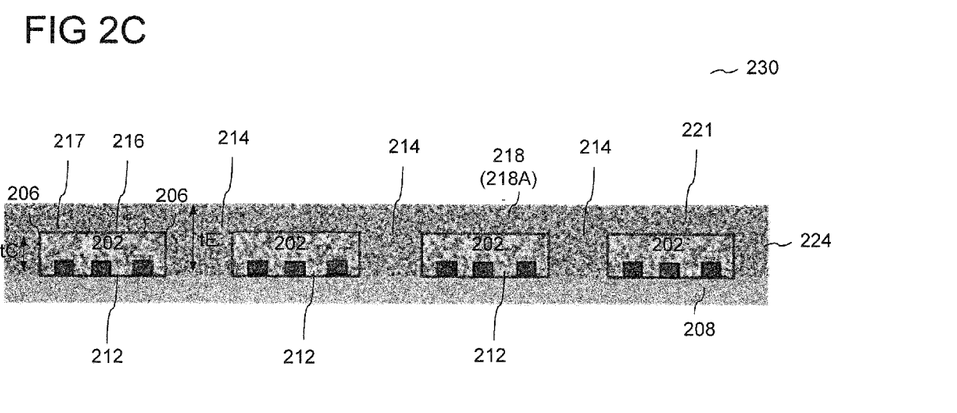

As shown in view 230 of FIG. 2C, at least three sides 206, 216 of chip 202 may be covered by encapsulation material 218, wherein encapsulation material 218 may be formed from adhesive material 218A. It may be understood that according to various embodiments, at least three sides may include three, four, five six or more sides of chip 202. At least three sides 206, 216 of chip 202 may include at least one chip back side 216 and at least one chip side wall 206, for example side walls 206 of chip 202 and back side 216 of chip 202. Front side 212 of chip 202 may be held by and be arranged facing temporary carrier 208, and thus may be free from encapsulation material 218. It may be understood that encapsulation material 218 may fully surround chip 202, except on at least one side of chip 202, e.g. except on front side 212 of chip 202.

Front side 212 may also be referred to as a "first side", "top side" or "upper side" of the chip. The terms "top side", "first side", "front side" or "upper side" may be used interchangeably hereinafter. Back side 216 may also be referred to as "second side" or "bottom side" of the chip. The terms "second side", "back side", or "bottom side" may be used interchangeably hereinafter.

As used herein with respect to semiconductor chips, e.g. power devices and logic devices, the terms "top side", "first side", "front side" or "upper side" may be understood to refer to the side of the chip wherein electrical components, e.g. electrically active regions of devices in the chip may be formed. Typically, at least one contact pad may be formed over the chip front side, wherein the at least one contact pad may be an electrode connected to an active region of the devices in the chip. As examples, electrically active regions of the device may include, electrical source regions, electrical drain regions, electrical channel regions and electrical gate regions.

The terms "second side", "back side", or "bottom side" may be understood to refer to the side of the chip opposite to the front side. In some semiconductor chips, the back side may be free from metallization, e.g. free from any contact pads, for example in the case of semiconductor logic chips. In other semiconductor chips, e.g. semiconductor power chips, a back side metallization, e.g. a back side contact pad, may be formed on the chip back side. Therefore, a semiconductor power transistor may support a vertical current flow through the chip, for example between a contact pad on the chip front side and a contact pad formed over a chip back side.

Chip 202 may include at least one contact pad 226 formed over chip front side 212, which may not be covered by encapsulation material. Chip 202 may also optionally include an electrical contact 217 formed on a side, e.g. at least one of sides 206, 216 of chip 202 covered by encapsulation material 218. According to an embodiment, electrical contact 217 may be formed on back side 216 of chip 202. In other words, electrical contact 217 may include or be a back side metallization contact.

Encapsulation material 218 may include or consist of adhesive material 218A. Adhesive material 218A may include at least one material from the following group of materials, the group of materials consisting of: polyimide, epoxy, acrylate, silicone, Polyethylene terephthalate, Polysulfone, Poly (p-phenylene) sulfide, Pelyetherketone, Polyetheretherketone and Liquid Crystalline Polymers. Adhesive material 218A may include an electrically conductive material. Adhesive material 218A may include or have a thermal conductance of at least about 1 W/mK. For example, adhesive material 218A may include or have a thermal conductance of at least about 50 W/mK.

Adhesive material 218A may include an electrically conductive, two-stage curing material. Encapsulation material 218, which may include, or consist of adhesive material 218A, may be applied over or directly on chip back side 216, over or directly on chip side walls 206 as well as in gaps 214 between neighboring chips 202. This can be achieved by a pressure, dispensing, printing or spin coating process.

Figure 2D:
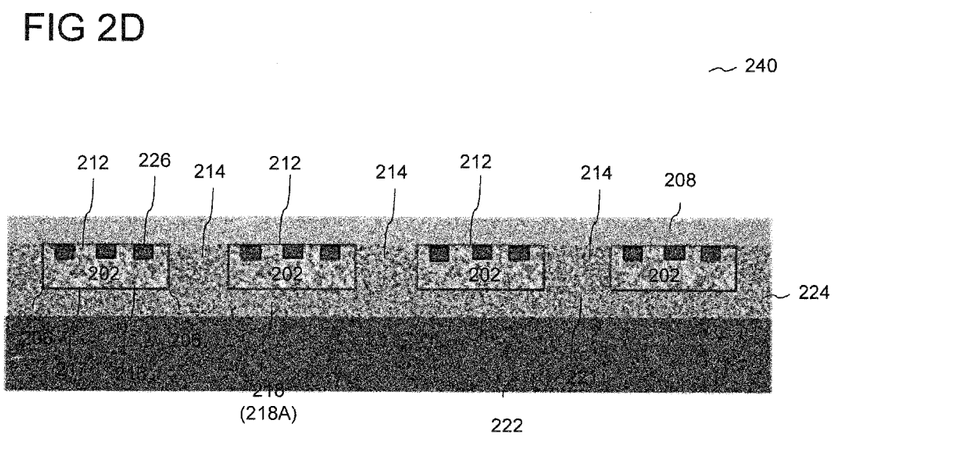

As shown in view 240 of FIG. 2D, carrier 222 may be adhered to chip 202 by means of encapsulation material 218. Carrier 222 may be disposed in and/or over encapsulation material 218. Adhesive material 218A may be configured to adhere carrier 222 to one of at least three sides 206, 216 of chip 202. For example, adhesive material 218A may be configured to adhere carrier 222 to chip back side 216, or to electrical contact 217. For example, adhesive material 218A may be configured to adhere carrier 222 to chip back side 216 and chip side walls 206.

Encapsulation material 218 and plurality of individualized chips 202 may form reconstituted wafer 224. Plurality of individualized chips 202 may be held together, in substrate form, by encapsulation material 218.

Reconstituted wafer 224 may be placed over carrier 222. Encapsulation material 218, i.e. adhesive material 218A, may be form-fittedly adhered to carrier 222 with B-stage curing. In other words, encapsulation material 218, i.e. adhesive material 218A, may only be partially cured so that carrier 222 may be attached. Typical b-stage curing temperatures may range from about 50° C. to 150° C.

Adhesive material 218A may include an electrically conductive material. For example, encapsulation material may include or be an electrically conductive die attach encapsulant. Adhesive material 218A may be configured to electrically connect at least one of a chip back side 216 and a chip side wall 206 to carrier 222. Carrier 222 may be adhered directly to adhesive material 218A.

Carrier 222 may include a lead frame material. For example, carrier 222 may include metal. For example, carrier 222 may include at least one material, element or alloy from the following group of materials, the group consisting of: copper, aluminum, silver, tin, gold, palladium, zinc, nickel, iron. Carrier 222 may be in the form of a sheet and/or foil. Carrier 222 may be referred to as a chip-external contact, which may be external to chip 202. Carrier 222, i.e. chip-external contact, may be electrically connected to chip back side 216 and/or electrical contact 217, by means of encapsulation material 218.

Adhesive material 218A may include filler particles 221. According to an embodiment, filler particles 221 may be electrically conductive. According to an embodiment, filler particles 221 may include at least one material from the following group of materials, the group of materials consisting of: copper, silver, carbon, boron nitride, insulating polymer coated conductive silver, insulating polymer coated conductive copper and insulating polymer coated conductive carbon. Filler particles 221 may form about 15 volume % to about 90 volume % of adhesive material 218A, the rest of adhesive material 218A being formed by matrix material, e.g. at least one of polyimide, epoxy, acrylate or silicone.

Encapsulation material 218 may cover at least one side wall 206. At least one side wall 206 of chip 202 may be electrically insulated from encapsulation material 218, for example, via optionally deposited additional isolation layer 207 (not shown). Alternatively, at least one side wall 206 may be electrically connected to encapsulation material 218. For example, side walls 206 and chip back side 216 or side walls 206 and chip back side electrical contact 217, may be electrically connected, i.e. shorted, such that the same voltage may be applied to them. For example, electrical contact 217 may be formed over chip back side 216 as well as over side walls 206.

As a result, encapsulation material 218 may also serve the function of electrically contacting chip 202, and rewiring chip back side 216 and possibly even chip side walls 206; for example, by redirecting electrically current between chip back side electrical contact 217 and carrier 202 and/or chip side walls 206. Furthermore, encapsulation material 218 may also have a higher thermal conductivity, e.g. larger than 1 W/mK, e.g. larger than 50 W/mK, than conventional mold materials whose thermal conductivity is normally about 1 W/mK. Therefore heat dissipation from chip 202 may be increased.

Figure 2E:
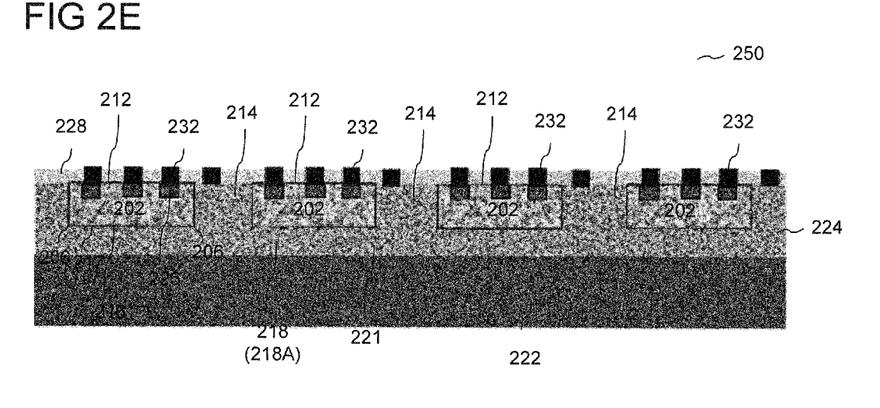

As shown in view 250 of FIG. 2E, after adhesion of carrier 222 to chip 202 via encapsulation material 218, temporary carrier 208 may be removed, and the application of electrical contacts and dielectrics over chip front side 212 may be carried out. Electrical interconnects may be electrically connected and/or physically attached to chips 202. Chips 202 may be encapsulated with dielectric materials and electrically conductive tape may be formed at chip front side 212.

Electrically insulating material 228 may cover a side of chip 202 not covered by encapsulation material 218, i.e. chip front side 212. Electrically insulating material 228 may optionally be deposited by means of an electrically insulating foil or film, e.g. polyimide film. Alternatively, conventional deposition methods such as spin-coating, chemical vapor deposition, evaporation may be used for the formation of electrically insulating material over chip front side 212.

At least one electrical interconnect 232, e.g. a plurality of electrical interconnects 232 may be formed through electrically insulating material 228, such the electrical interconnects 232 may be electrically insulated by electrically insulating material 238. Electrical interconnects 232 may be arranged such that they may be in electrical connection with chip 202. For example, each electrical interconnect 232 may be in electrical connection with one or more chip contact pads 226 formed over chip front side 212.

Figure 2F:
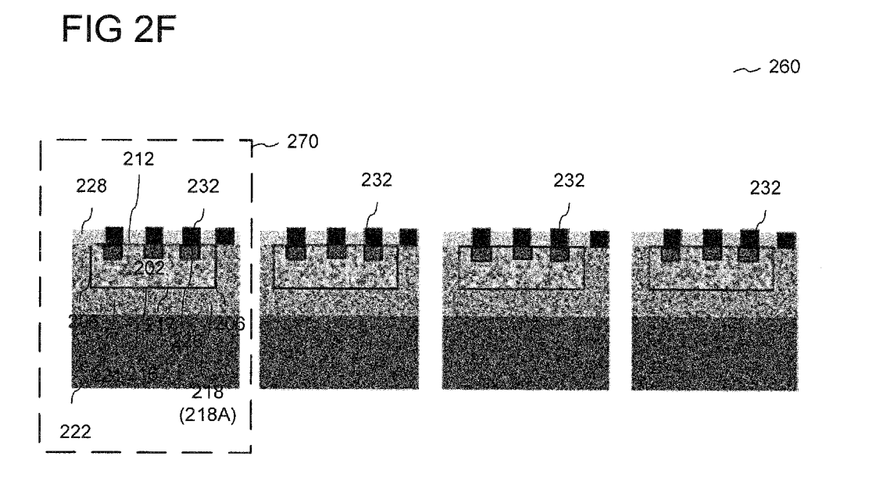

As shown in view 260 of FIG. 2F, individualization of the entire component may be carried out. In other words, a singulated device 270, which may also be referred to as integrated circuit 270, may be separated from other devices or integrated circuits by dicing through electrically insulating material 228, encapsulation material 218 and carrier 222. Singulated devices may be readily assembled onto a printed circuit board (PCB).

It may be understood that integrated circuit 270 may include:
 chip 202;
 encapsulation material 218 covering at least three sides 206, 216 of chip 202, wherein encapsulation material 218 may be formed from adhesive material 218A; and carrier 222 adhered to chip 202 by means of encapsulation material 218.

Figure 3:
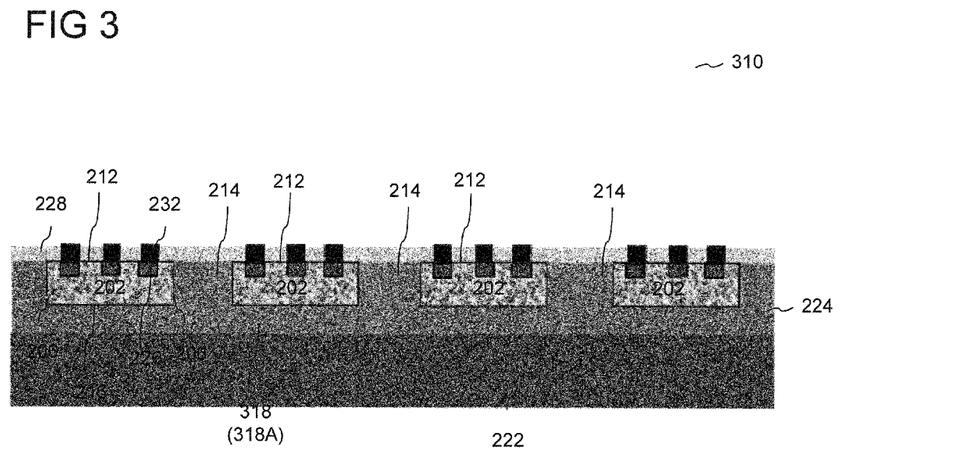
FIG. 3 shows part of a method for manufacturing an integrated circuit according to an embodiment.

According to various embodiments, as shown in FIG. 3, instead of encapsulation material 218, encapsulation material 318 may be used instead. Encapsulation material 318 may be identical to encapsulation material 218, except that encapsulation material 318 may be electrically insulating. For example, encapsulation material 318 may be formed from adhesive material 318A (analogous to adhesive material 218A), however encapsulation material 318 may be free from any filler particles described above, e.g. silver particles, copper particles and copper particles. For example, encapsulation material 318 may be an adhesive material 318A, which may include or consist of at least one material from the following group of materials, the group of materials consisting of: polyimide, epoxy, acrylate, silicone, Polyethylene terephthalate.

Figure 4:
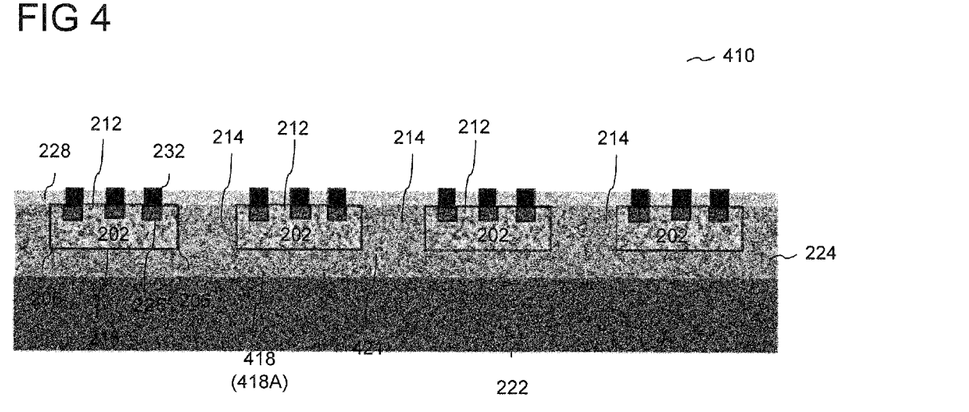
FIG. 4 shows part of a method for manufacturing an integrated circuit according to an embodiment.

According to various embodiments, as shown in FIG. 4, instead of encapsulation material 218, encapsulation material 418 may be used instead. Encapsulation material 418 may be identical to encapsulation material 218, except that encapsulation material 418 may include filler particles 421 instead of filler particles 221. In other words, instead of including filler particles such as copper and/or silver and/or carbon described above, adhesive material 418A may include electrically insulating filler particles 421. For example, adhesive material 418A may include filler particles 421, wherein filler particles 421 may include at least one material from the following group of materials, the group of materials consisting of: aluminum oxide, silicon oxide, boron nitride, insulating polymer coated conductive silver, insulating polymer coated conductive copper and insulating polymer coated conductive carbon.

These electrically insulating filler particles 421 may result in a reduction of coefficient of thermal expansion (CTE), which may be better adapted to carrier 222, e.g. to copper, or to chip 202, e.g. to silicon. These electrically insulating filler particles 421 may further result in the reduction in absorption of moisture.

Figure 5:
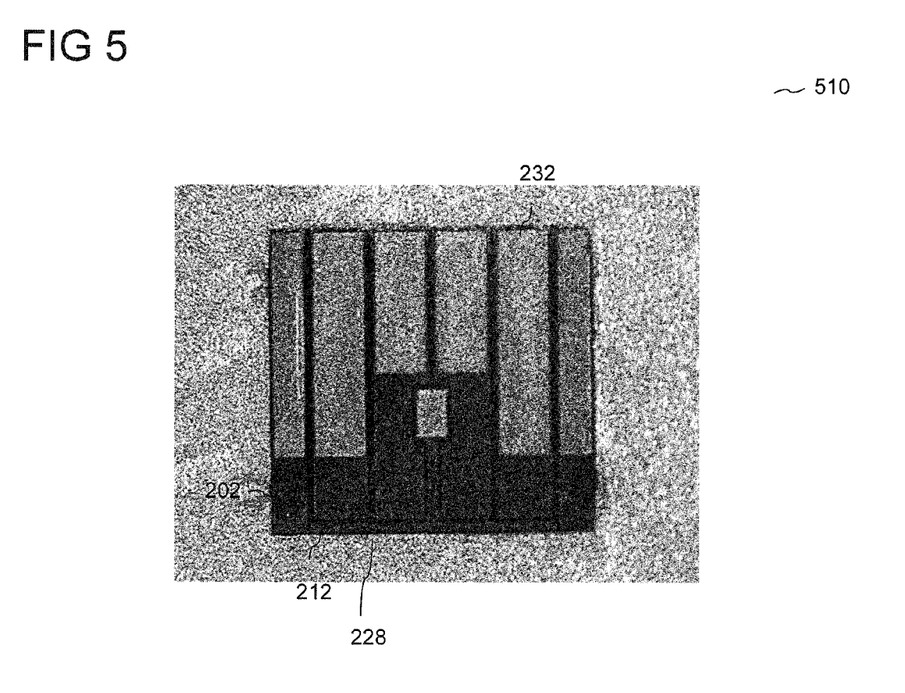
FIG. 5 shows an integrated circuit according to an embodiment.

FIG. 5 shows top view 510 of chip front side 212, wherein an electrically conductive adhesive material such as covering foil may form at least one electrical interconnect 232, and may be formed over electrically insulating material 228, which may include for example, an electrically insulating foil, e.g. polyimide foil.

Figure 6:
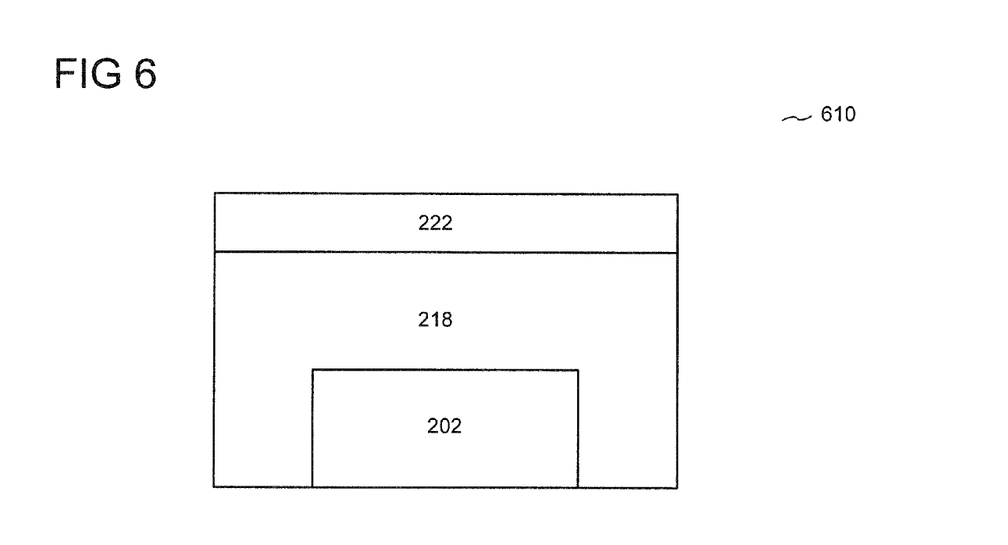
FIG. 6 shows an integrated circuit according to an embodiment.
Figure 7:
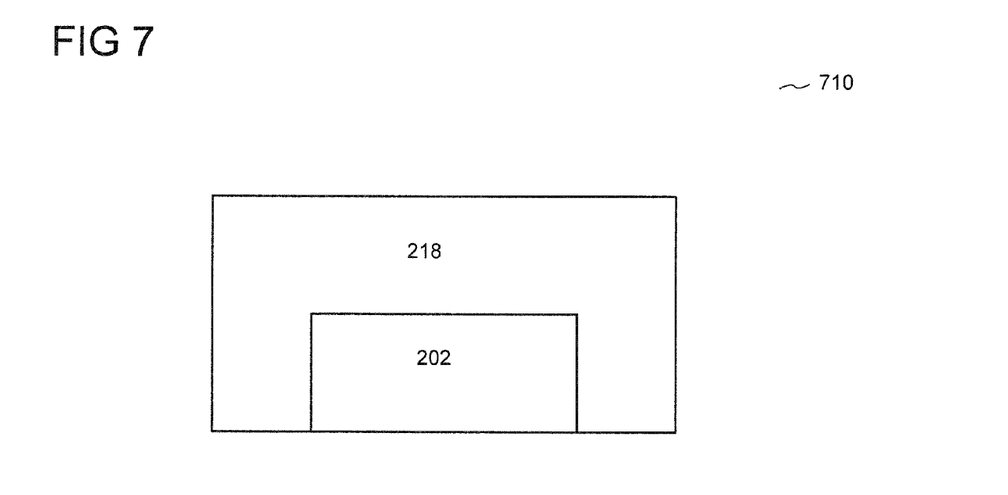
FIG. 7 shows an integrated circuit according to an embodiment.

FIGS. 6 and 7 show integrated circuits which may be manufactured according to any one of methods 100 to 300, individually or in combination.

FIG. 6 shows an illustration of an integrated circuit 610 according to an embodiment. Integrated circuit 610 may include:
 chip 202;
 encapsulation material 218 covering at least three sides 206, 216 of chip 202, wherein encapsulation material 218 may be formed from adhesive material 218A; and
 carrier 222 adhered to chip 202 by means of encapsulation material 218.

FIG. 7 shows an illustration of an integrated circuit 710 according to an embodiment. Integrated circuit 710 may include:

encapsulation material 218 covering at least three sides 206, 216 of chip 202, wherein encapsulation material 218 may be formed from electrically conductive material.

According to various embodiments, chip 202 may be fixed, via encapsulation material 218, e.g. adhesive material 218A, onto carrier 222, and using a higher temperature processes, chip 202 may be surrounded by encapsulation material 218, which may include for example an adhesive film.

According to various embodiments, sawing may not have to be carried out through brittle silicon and soft glue/polymer material. Furthermore, better component reliability may be achieved and fewer process steps may be required. Adhesive material 218A may also function as an encapsulation material, e.g. encapsulation material 218, and vice versa. Encapsulation material 218, i.e. adhesive material 218A may be an electrically conductive material. Direct contact of the chip may be possible, e.g. by applying electrically conducting and/or thermally conducting encapsulation material 218 directly onto chip 202. Various improvements may be achieved with regards to thin and small chips, in comparison to using standard mold compounds.

Various embodiments provide an integrated circuit, including: a chip; encapsulation material covering at least three sides of the chip, wherein the encapsulation material is formed from adhesive material; and a carrier adhered to the chip by means of the encapsulation material.

According to an embodiment, the at least three sides of the chip include at least one chip back side and at least one chip side wall.

According to an embodiment, the chip includes at least one chip back side metallization layer formed over the at least one chip back side.

According to an embodiment, the adhesive material includes an electrically conductive material.

According to an embodiment, the adhesive material includes a thermal conductance of at least about 1 W/mK.

According to an embodiment, the adhesive material includes a thermal conductance of at least about 50 W/mK.

According to an embodiment, the adhesive material is configured to adhere the carrier to one of the at least three sides of the chip.

According to an embodiment, the adhesive material is configured to adhere the carrier to a chip back side.

According to an embodiment, the adhesive material is configured to electrically connect at least one of a chip back side and a chip side wall to the carrier.

According to an embodiment, the adhesive material includes at least one material from the following group of materials, the group of materials consisting of: polyimide, epoxy, acrylate, silicone, Polyethylene terephthalate, Polysulfone, Poly (p-phenylene)sulfide, Pelyetherketone, Polyetheretherketone and Liquid Crystalline Polymers.

According to an embodiment, the adhesive material includes filler particles, wherein the filler particles include at least one material from the following group of materials, the group of materials consisting of: copper, silver, carbon, boron nitride, insulating polymer coated conductive silver, insulating polymer coated conductive copper and insulating polymer coated conductive carbon.

According to an embodiment, the adhesive material includes filler particles, wherein the filler particles include at least one material from the following group of materials, the group of materials consisting of: aluminum oxide, silicon oxide, boron nitride, insulating polymer coated conductive silver, insulating polymer coated conductive copper and insulating polymer coated conductive carbon.

According to an embodiment, a side of the chip not covered by the encapsulation material includes a chip front side, wherein the chip includes at least one contact pad formed over the chip front side.

According to an embodiment, the carrier includes a lead frame material.

According to an embodiment, the carrier includes metal.

According to an embodiment, the integrated circuit further includes an electrically insulating material covering a side of the chip not covered by the encapsulation material.

According to an embodiment, the integrated circuit further includes at least one electrical interconnect formed through the electrically insulating material, wherein the at least one electrical interconnect is in electrical connection with the chip.

Various embodiments provide an integrated circuit, including: a chip; encapsulation material covering at least three sides of the chip, wherein the encapsulation material is formed from electrically conductive material.

According to an embodiment, the chip includes an electrical contact on a side of the chip covered by the encapsulation material.

According to an embodiment, the integrated circuit further includes a chip-external contact external to the chip, wherein the chip-external contact is disposed at least one of in and over the encapsulation material.

According to an embodiment, the chip-external contact is electrically coupled to the electrical contact by means of the encapsulation material.

According to an embodiment, at least one side wall of the chip is electrically insulated from the encapsulation material.

Various embodiments provide a method for manufacturing an integrated circuit, the method including: covering at least three sides of a chip by an encapsulation material, wherein the encapsulation material is formed from adhesive material; and adhering a carrier to the chip by means of the encapsulation material.

According to an embodiment, the encapsulation material includes an electrically conductive material.

According to an embodiment, adhering a carrier to the chip by means of the encapsulation material further includes electrically connecting the carrier to a chip back side by means of the encapsulation material and covering at least one side wall with the encapsulation material.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit, comprising:
   a chip comprising a front side, a back side opposite the front side, and a plurality of sidewalls, wherein one or more electrical contacts are formed over the chip back side and at least one of the chip sidewalls;
   an encapsulation material covering surfaces of at least three sides of the chip including the surface of the chip back side, wherein the encapsulation material does not substantially cover the surface of the chip front side, and wherein the encapsulation material is formed from an adhesive material;
   a carrier adhered to the chip by means of the encapsulation material an electrically insulating material covering the chip front side and covering a front surface of the encapsulation material;

at least one electrical interconnect extending through the electrically insulating material from the chip front side to an exposed front surface of the integrated circuit, wherein the at least one electrical interconnect is in electrical connection with the chip at the chip front side.

2. The integrated circuit according to claim 1, wherein the at least three sides of the chip comprise at least one chip back side and at least one chip side wall.

3. The integrated circuit according to claim 2, wherein the chip comprises at least one chip back side metallization layer formed over the at least one chip back side.

4. The integrated circuit according to claim 1, wherein the adhesive material comprises an electrically conductive material.

5. The integrated circuit according to claim 1, wherein the adhesive material comprises a thermal conductance of at least about 1 W/mK.

6. The integrated circuit according to claim 1, wherein the adhesive material comprises a thermal conductance of at least about 50 W/mK.

7. The integrated circuit according to claim 1, wherein the adhesive material is configured to adhere the carrier to one of the at least three sides of the chip.

8. The integrated circuit according to claim 1, wherein the adhesive material is configured to adhere the carrier to a chip back side.

9. The integrated circuit according to claim 1, wherein the adhesive material is configured to electrically connect at least one of a chip back side and a chip side wall to the carrier.

10. The integrated circuit according to claim 1, wherein the adhesive material comprises at least one material from the following group of materials, the group of materials consisting of polyimide, epoxy, acrylate, silicone, Polyethylene terephthalate, Polysulfone, Poly (p-phenylene) sulfide, Pelyetherketone, Polyetheretherketone, Liquid Crystalline Polymers.

11. The integrated circuit according to claim 1, wherein the adhesive material comprises filler particles, wherein the filler particles comprise at least one material from the following group of materials, the group of materials consisting of: copper, silver, carbon, boron nitride, insulating polymer coated conductive silver, insulating polymer coated conductive copper and insulating polymer coated conductive carbon.

12. The integrated circuit according to claim 1, wherein the adhesive material comprises filler particles, wherein the filler particles comprise at least one material from the following group of materials, the group of materials consisting of: aluminum oxide, silicon oxide.

13. The integrated circuit according to claim 1, wherein the side of the chip not covered by the encapsulation material comprises the chip front side, wherein the chip comprises at least one contact pad formed over the chip front side.

14. The integrated circuit according to claim 1, wherein the carrier comprises a lead frame material.

15. The integrated circuit according to claim 1, wherein the carrier comprises metal.

16. An integrated circuit, comprising:
a chip comprising a front side, a back side opposite the front side, and a plurality of sidewalls, wherein one or more electrical contacts are formed over the chip back side and at least one of the chip sidewalls;

an encapsulation material covering surfaces of at least three sides of the chip, including the surface of the chip back side, wherein the encapsulation material does not cover the surface of the chip front side and wherein the encapsulation material is formed from an electrically conductive material an electrically insulating material covering the chip front side and covering a front surface of the encapsulation material.

17. The integrated circuit of claim 16, wherein the chip comprises an electrical contact on a side of the chip covered by the encapsulation material.

18. The integrated circuit of claim 16, further comprising:
a chip-external contact external to the chip, wherein the chip-external contact is disposed at least one of in and over the encapsulation material.

19. The integrated circuit of claim 18, wherein the chip-external contact is electrically coupled to the electrical contact by means of the encapsulation material.

20. The integrated circuit of claim 16, wherein at least one side wall of the chip is electrically insulated from the encapsulation material.

* * * * *